(12) United States Patent
Huh et al.

(10) Patent No.: US 8,747,702 B2
(45) Date of Patent: Jun. 10, 2014

(54) CONDUCTIVE POLYMER, CONDUCTIVE POLYMER COMPOSITION, CONDUCTIVE POLYMER LAYER, AND ORGANIC PHOTOELECTRIC DEVICE INCLUDING THE CONDUCTIVE POLYMER LAYER

(75) Inventors: Dal-Ho Huh, Uiwang-si (KR); Kyoung-Mi Lee, Uiwang-si (KR); Eui-Su Kang, Uiwang-si (KR); Mi-Young Chae, Uiwang-si (KR); Jeong-Woo Lee, Uiwang-si (KR)

(73) Assignee: Cheil Industries, Inc., Gumi-Si, Kyeongsangbuk-Do (KR)

( * ) Notice: Subject to any disclaimer, the term of this patent is extended or adjusted under 35 U.S.C. 154(b) by 0 days.

(21) Appl. No.: 13/538,028

(22) Filed: Jun. 29, 2012

(65) Prior Publication Data
US 2012/0326094 A1 Dec. 27, 2012

Related U.S. Application Data

(63) Continuation of application No. PCT/KR2010/008555, filed on Dec. 1, 2010.

(30) Foreign Application Priority Data

Dec. 29, 2009 (KR) .................. 10-2009-0133230

(51) Int. Cl.
*H01B 1/00* (2006.01)
*C08G 75/00* (2006.01)
*C08G 73/00* (2006.01)
*C08G 73/06* (2006.01)

(52) U.S. Cl.
USPC ............ 252/500; 528/377; 528/422; 528/423

(58) Field of Classification Search
USPC ................ 252/500–521.6; 528/377, 422, 423
See application file for complete search history.

(56) References Cited

U.S. PATENT DOCUMENTS

| 4,539,507 A | 9/1985 | VanSlyke et al. |
| 4,720,432 A | 1/1988 | VanSlyke et al. |
| 4,769,292 A | 9/1988 | Tang et al. |

(Continued)

FOREIGN PATENT DOCUMENTS

| CN | 1688633 A | 10/2005 |
| CN | 1880377 A | 12/2006 |

(Continued)

OTHER PUBLICATIONS

International Search Report in PCT/KR2010/008555, dated Aug. 30, 2011 (Huh, et al.).

(Continued)

*Primary Examiner* — Mark Kopec
*Assistant Examiner* — Jaison Thomas

(57) ABSTRACT

A conductive polymer, a conductive polymer composition, a conductive polymer layer, and an organic photoelectric device including the conductive polymer layer, the conductive polymer being doped with a polyacid copolymer, the polyacid copolymer being represented by the following Chemical Formula 1:

[Chemical Formula 1]

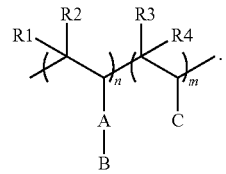

15 Claims, 2 Drawing Sheets

(56) References Cited

U.S. PATENT DOCUMENTS

| | | |
|---|---|---|
| 5,317,169 A | 5/1994 | Nakano et al. |
| 5,486,406 A | 1/1996 | Shi |
| 5,955,528 A | 9/1999 | Sato et al. |
| 5,986,046 A | 11/1999 | Nishiyama et al. |
| 6,099,980 A | 8/2000 | Schoo et al. |
| 6,420,056 B1 | 7/2002 | Chondroudis et al. |
| 7,875,208 B2 | 1/2011 | Huh et al. |
| 7,968,651 B2 | 6/2011 | Huh et al. |
| 2003/0052310 A1* | 3/2003 | Michot et al. ............... 252/500 |
| 2004/0254297 A1 | 12/2004 | Hsu et al. |
| 2005/0202274 A1 | 9/2005 | Elschner et al. |
| 2006/0261332 A1 | 11/2006 | Lee et al. |
| 2008/0017852 A1 | 1/2008 | Huh et al. |
| 2008/0105854 A1* | 5/2008 | Huh et al. ............... 252/519.21 |
| 2008/0234442 A1 | 9/2008 | Huh et al. |
| 2010/0237294 A1 | 9/2010 | Lee et al. |
| 2010/0302714 A1* | 12/2010 | Kobayakawa et al. ........ 361/529 |

FOREIGN PATENT DOCUMENTS

| | | |
|---|---|---|
| CN | 101186685 A | 5/2008 |
| CN | 101331557 A | 12/2008 |
| EP | 0 387 715 A2 | 9/1990 |
| JP | 08-225579 A | 9/1996 |
| JP | 10-251384 A | 9/1998 |
| JP | 2987865 | 10/1999 |
| JP | H 11-514142 A | 11/1999 |
| JP | 2001-048938 A | 2/2001 |
| JP | 2001-126874 A | 5/2001 |
| JP | 2002-075001 A | 3/2002 |
| KR | 10-0527100 B | 11/2005 |
| KR | 10 2006-0120378 A | 11/2006 |
| KR | 10-2007-0048076 A | 5/2007 |
| KR | 10-0762014 B1 | 9/2007 |
| KR | 10 2008-0077876 A | 8/2008 |
| KR | 10 2008-0090365 A | 10/2008 |
| KR | 10 2009-0056682 A | 6/2009 |
| WO | WO 98/03042 A1 | 1/1998 |

OTHER PUBLICATIONS

Chinese Search Report dated Nov. 12, 2013.

* cited by examiner

CONDUCTIVE POLYMER, CONDUCTIVE POLYMER COMPOSITION, CONDUCTIVE POLYMER LAYER, AND ORGANIC PHOTOELECTRIC DEVICE INCLUDING THE CONDUCTIVE POLYMER LAYER

CROSS-REFERENCE TO RELATED APPLICATION

This application is a continuation of pending International Application No. PCT/KR2010/008555, entitled "Conductive Polymer, Conductive Polymer Composition, Conductive Polymer Composition Layer and Organic Photoelectric Device Using the Same," which was filed on Dec. 1, 2010, the entire contents of which are hereby incorporated by reference.

BACKGROUND

1. Field of the Invention

Embodiments relate to a conductive polymer, a conductive polymer composition, a conductive polymer layer, and an organic photoelectric device including the conductive polymer layer.

2. Description of the Related Art

A photoelectric device is a device for transforming photo-energy to electrical energy and conversely, for transforming electrical energy to photo-energy. The photoelectric device may be exemplified by an organic light emitting diode, a solar cell, a transistor, or the like.

For example, the organic light emitting diodes (OLED) have been considered due to increasing demand for a flat panel display (FPD).

Recently, LCDs, which have been remarkably developed through technology, have had an increased market share of greater than or equal to 80% in the FPD market. However, response speed may be slow and viewing angle may be narrow in a wide display of 40 inches or larger.

In this regard, the organic light emitting diode has drawn attention as a display mode for the next generation FPD since it has many merits in that it is driven at a low voltage, it is self-light-emitting, it can be formed as a thin film, it has a wide viewing angle, high response speed, and high contrast, and is economical to produce.

In the field of photoelectric devices including the organic light emitting diode, formation of a conductive polymer layer in order to improve efficiency of a photoelectric device by smoothly transferring charges generated in an electrode, i.e., holes and electrons, to the photoelectric device, has been considered.

For example, an organic light emitting diode is an active light emitting display device that takes advantage of a phenomenon in which electrons and holes are combined in an organic layer while emitting light when an electrical current flows to a fluorescent or phosphorescent organic compound thin film (hereinafter referred to as an organic layer). The organic light emitting diode may not use a single light emission layer as the organic layer but may employ a multi-layer structure including a hole injection layer (HIL) using a conductive polymer, a light emission layer, and an electron injection layer (EIL) to improve efficiency and decrease the driving voltage.

The multi-layer structure may be simplified by making one layer perform a plurality of functions. One of the simplest OLED structures is a structure where an organic layer performing all functions including the function of a light emission layer is interposed between two electrodes.

SUMMARY

Embodiments are directed to a conductive polymer, a conductive polymer composition, a conductive polymer layer, and an organic photoelectric device including the conductive polymer layer.

The embodiments may be realized by providing a conductive polymer doped with a polyacid copolymer, the polyacid copolymer being represented by the following Chemical Formula 1:

[Chemical Formula 1]

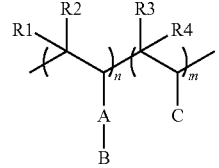

wherein, in Chemical Formula 1, A is selected from the group of a substituted or unsubstituted C1 to C30 alkylene group; a substituted or unsubstituted C1 to C30 heteroalkylene group; a substituted or unsubstituted C1 to C30 alkoxy group; a substituted or unsubstituted C1 to C30 heteroalkoxy group; a substituted or unsubstituted C6 to C30 arylene group, a substituted or unsubstituted C6 to C30 arylalkylene group, a substituted or unsubstituted C6 to C30 aryloxy group, a substituted or unsubstituted C2 to C30 heteroarylene group, a substituted or unsubstituted C2 to C30 heteroarylalkylene group; a substituted or unsubstituted C2 to C30 heteroaryloxy group; a substituted or unsubstituted C5 to C20 cycloalkylene group; a substituted or unsubstituted C2 to C30 heterocycloalkylene group; a substituted or unsubstituted C1 to C30 alkyleneester group; a substituted or unsubstituted C1 to C30 heteroalkyleneester group; a substituted or unsubstituted C6 to C30 aryleneester group; and a substituted or unsubstituted C2 to C30 heteroaryleneester group, B is an ionic group or a group including an ionic group, the ionic group including a pair of a cation and an anion in which the cation is $Na^+$, $K^+$, $Li^+$, $Mg^{2+}$, $Zn^{2+}$, $Al^{3+}$, $H^+$, $NH_3$, or an organic ion of $CH_3(\text{---}CH_2\text{---})_n$, in which n is a natural number of 1 to 50, and the anion is $PO_3^-$, $SO_3^-$, $COO^-$, $I^-$, or $CH_3COO^-$, C is an organic ion salt including an anion and a cation, R1 to R4 are each independently selected from the group of hydrogen, a substituted or unsubstituted C1 to C10 alkyl, a substituted or unsubstituted C6 to C20 aryl, and a substituted or unsubstituted C3 to C20 heteroaryl, and $0<m\leq10,000,000$, $0<n<10,000,000$, and $0.0001\leq m/n\leq 100$.

C may be an organic ion salt represented by one of the following Chemical Formulae 2 to 5:

[Chemical Formula 2]

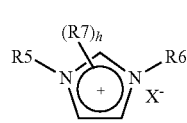

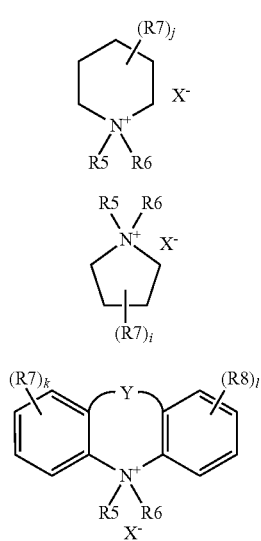

[Chemical Formula 3]

[Chemical Formula 4]

[Chemical Formula 5]

wherein, in Chemical Formulae 2 to 5, one of R5 to R8 is selected from the group of a single bond, a substituted or unsubstituted C1 to C30 alkylene group, a substituted or unsubstituted C1 to C30 heteroalkylene group, a substituted or unsubstituted C1 to C30 alkoxylene group, a substituted or unsubstituted C1 to C30 heteroalkoxylene group, a substituted or unsubstituted C6 to C30 arylene group, a substituted or unsubstituted C6 to C30 arylalkylene group, a substituted or unsubstituted C2 to C30 heteroarylene group, a substituted or unsubstituted C2 to C30 heteroarylalkylene group, a substituted or unsubstituted C5 to C20 cycloalkylene group, and a substituted or unsubstituted C2 to C30 heterocycloalkylene group, and is bound to a main chain of the polyacid copolymer, and remaining ones of R5 to R8 are each independently selected from the group of hydrogen, a substituted or unsubstituted C1 to C30 alkyl group, a substituted or unsubstituted C1 to C30 heteroalkyl group, a substituted or unsubstituted C1 to C30 alkoxy group, a substituted or unsubstituted C1 to C30 heteroalkoxy group, a substituted or unsubstituted C6 to C30 aryl group, a substituted or unsubstituted C6 to C30 arylalkyl group, a substituted or unsubstituted C6 to C30 aryloxy group, a substituted or unsubstituted C2 to C30 heteroaryl group, a substituted or unsubstituted C2 to C30 heteroarylalkyl group, a substituted or unsubstituted C2 to C30 heteroaryloxy group, a substituted or unsubstituted C5 to C20 cycloalkyl group, a substituted or unsubstituted C2 to C30 heterocycloalkyl group, a substituted or unsubstituted C1 to C30 alkylester group, a substituted or unsubstituted C1 to C30 heteroalkylester group, a substituted or unsubstituted C6 to C30 arylester group, and a substituted or unsubstituted C2 to C30 heteroarylester group, X is selected from the group of F, Cl, Br, I, $BF_4$, $PF_6$ and $(C_nF_{2n+1}SO_2)_2N$, in which n is a natural number of 1 to 50, Y is selected from the group of —CH2—, —CR'R"—, —NH—, —NR'—, —O—, —P—, —P═O—, —S—, and —SiR'R"—, in which R' and R" are each independently selected from the group of hydrogen, a substituted or unsubstituted C1 to C10 an alkyl, a substituted or unsubstituted C6 to C20 aryl, and a substituted or unsubstituted C3 to C20 heteroaryl, h is an integer of 1 to 3, i is an integer of 1 to 8, j is an integer of 1 to 10, k is an integer of 1 to 4, and l is an integer of 1 to 4.

C may be the organic ion salt represented by Chemical Formula 2, in which X is $(CF_3SO_2)_2N$, R7 is hydrogen or a methyl group, R6 is an ethyl group, and R5 is one of a single bond, a methylene group, and a phenylmethylene group bound to the main chain of the polyacid copolymer.

The conductive polymer may be a polymer which is obtained by polymerizing one selected from the group of a monomer of polyphenylene, polyphenylenevinylene, polyaniline, or a derivative thereof represented the following Chemical Formula 6; a monomer of pyrrole represented by the following Chemical Formula 7, a monomer of thiophene or a derivative thereof:

[Chemical Formula 6]

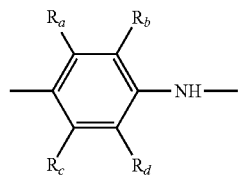

[Chemical Formula 7]

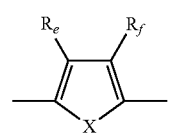

wherein, in Chemical Formulae 6 and 7, X is NH; or a heteroatom selected from N, O, S, and P bound to a C1 to C20 alkyl group or a C6 to C20 aryl group, Ra, Rb, Rc, and Rd are each independently selected from the group of hydrogen; a C1 to C30 alkyl group; a C1 to C30 heteroalkyl group; a C1 to C30 alkoxy group; a C1 to C30 heteroalkoxy group; a C6 to C30 aryl group; a C6 to C30 arylalkyl group; a C6 to C30 aryloxy group; a C6 to C30 arylamine group; a C6 to C30 pyrrole group; a C6 to C30 thiophene group; a C2 to C30 heteroaryl group; a C2 to C30 heteroarylalkyl group; a C2 to C30 heteroaryloxy group; a C5 to C20 cycloalkyl group; a C2 to C30 heterocycloalkyl group; a C1 to C30 alkylester group; a C1 to C30 heteroalkylester group; a C6 to C30 arylester group; and a C2 to C30 heteroarylester group, and Re and Rf are each independently selected from the group of NH; or a heteroatom selected from N, O, S, and P bound to a C1 to C20 alkyl group or a C6 to C20 aryl group; a C1 to C30 alkyl group; a C6 to C30 aryl group; a C1 to C30 alkoxy group; a C1 to C30 heteroalkyl group; a C1 to C30 heteroalkoxy group; a C6 to C30 arylalkyl group; a C6 to C30 aryloxy group; a C6 to C30 arylamine group; a C6 to C30 pyrrole group; a C6 to C30 thiophene group; a C2 to C30 heteroaryl group; a C2 to C30 heteroarylalkyl group; a C2 to C30 heteroaryloxy group; a C5 to C20 cycloalkyl group; a C2 to C30 heterocycloalkyl group; a C1 to C30 alkylester group; a C1 to C30 heteroalkylester group; a C6 to C30 arylester group; and a C2 to C30 heteroarylester group.

The conductive polymer may be a polymer obtained by polymerizing a monomer represented by the following Chemical Formula 8:

[Chemical Formula 8]

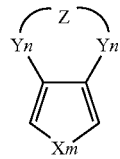

wherein, in Chemical Formula 8, X is NH, or a heteroatom selected from N, O, S, and P bound to a C1 to C20 alkyl group or a C6 to C20 aryl group, Y is NH, or a heteroatom selected from N, O, S, and P bound to a C1 to C20 alkyl group or a C6 to C20 aryl group, m and n are each independently an integer ranging from 0 to 9, and Z is —(CH$_2$)x—CRgRh—(CH$_2$)$_y$-, in which Rg and Rh are each independently selected from H, a C1 to C20 alkyl radical, a C6 to C14 aryl radical, and —CH$_2$—ORi, wherein Ri is selected from the group of H, a C1 to C6 alkyl acid a C1 to C6 alkylester, a C1 to C6 heteroalkyl acid, and a C1 to C6 alkylsulfonic acid.

The conductive polymer may be polythiophene.

A may be a phenylene group and B may be an ionic group including a pair of a cation and an anion, the cation being H$^+$ and the anion being SO$_3^-$.

The embodiments may also be realized by providing a conductive polymer composition for an organic photoelectric device, the conductive polymer composition including a solvent; and the conductive polymer according to an embodiment.

The solvent may be selected from the group of water, an alcohol, dimethyl formamide (DMF), dimethylsulfoxide, toluene, xylene, and chlorobenzene.

The conductive polymer composition may further include a physical cross-linking agent or a chemical cross-linking agent.

The composition may include the physical cross-linking agent, the physical cross-linking agent being at least one selected from the group of glycerol, butanol, polyvinylalcohol, polyethyleneglycol, polyethyleneimine, and polyvinylpyrrolidone.

The composition may include the chemical cross-linking agent, the chemical cross-linking agent being at least one selected from the group of tetraethyloxysilane, polyaziridine, a melamine-based polymer, and an epoxy-based polymer.

The physical cross-linking agent may be included in the composition in an amount of about 0.001 to about 5 parts by weight, based on 100 parts by weight of the conductive polymer composition.

The chemical cross-linking agent may be included in the composition in an amount of about 0.001 to about 50 parts by weight by weight, based on 100 parts by weight of the conductive polymer composition.

The embodiments may also be realized by providing a conductive polymer layer for an organic photoelectric device, the conductive polymer layer being formed using the conductive polymer composition according to an embodiment.

The embodiments may also be realized by providing an organic photoelectric device including the conductive polymer layer according to an embodiment.

The embodiments provide an organic photoelectric device having excellent luminous efficiency and life-span.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1A:
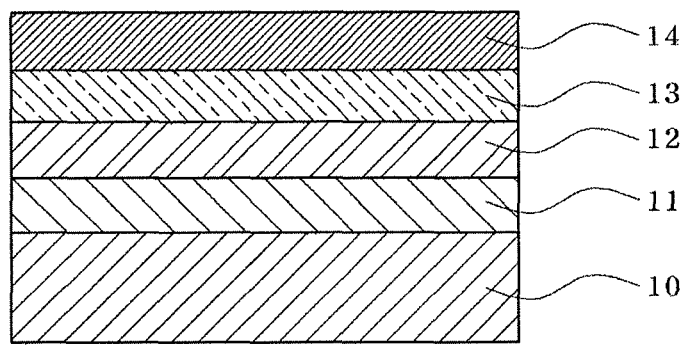
FIGS. 1A to 1D illustrate schematic cross-sectional views of organic light emitting diodes according to embodiments.

Korean Patent Application No. 10-2009-0133230, filed on Dec. 29, 2009, in the Korean Intellectual Property Office, and entitled, "Conductive Polymer, Conductive Polymer Composition, Conductive Polymer Composition Layer and Organic Photoelectric Device Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

The conductive polymer according to an embodiment is a conductive polymer doped with a polyacid copolymer. The polyacid copolymer may be represented by the following Chemical Formula 1. For example, the polyacid copolymer may be a random copolymer including repeating units, e.g., the units bracketed by n and m, represented by Chemical Formula 1. The embodiments also provide a conductive polymer composition including the doped conductive polymer dispersed in a solvent, and may further include a physical cross-linking agent and/or a chemical cross-linking agent.

[Chemical Formula 1]

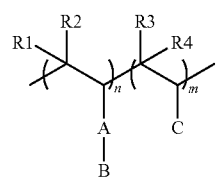

In Chemical Formula 1, A may be a carbon-based group. For example, A may be selected from the group of a substituted or unsubstituted C1 to C30 alkylene group; a substituted or unsubstituted C1 to C30 heteroalkylene group; a substituted or unsubstituted C1 to C30 alkoxy group; a substituted or unsubstituted C1 to C30 heteroalkoxy group; a substituted or unsubstituted C6 to C30 arylene group, a substituted or unsubstituted C6 to C30 arylalkylene group, a substituted or unsubstituted C6 to C30 aryloxy group, a substituted or unsubstituted C2 to C30 heteroarylene group, a substituted or unsubstituted C2 to C30 heteroarylalkylene group; a substituted or unsubstituted C2 to C30 heteroaryloxy group; a substituted or unsubstituted C5 to C20 cycloalkylene group; a substituted or unsubstituted C2 to C30 heterocycloalkylene group; a substituted or unsubstituted C1 to C30 alkyleneester group; a substituted or unsubstituted C1 to C30 heteroalkyleneester group; a substituted or unsubstituted C6 to C30 aryleneester group; and a substituted or unsubstituted C2 to C30 heteroaryleneester group B may be an ionic group or a group including an ionic group. For example, the ionic group may include a pair of a cation and an anion. In an implementation, the cation may include a metal ion (such as Na$^+$, K$^+$, Li$^+$, Mg$^{2+}$, Zn$^{2+}$, or Al$^{3+}$), H$^+$, NH$_3^+$, or an organic ion of CH$_3$(—CH$_2$—)$_n$ (in which n is a natural number of 1 to about 50). In an implementation, the anion may include PO$_3^-$, SO3$^-$, COO$^-$, I$^-$, or CH$_3$COO$^-$.

C may be, e.g., a cation of, an organic ion salt (that includes an anion and a cation). R1 to R4 may each independently be selected from the group of hydrogen, a substituted or unsubstituted C1 to C10 alkyl, a substituted or unsubstituted C6 to C20 aryl, and a substituted or unsubstituted C3 to C20 heteroaryl. m and n may satisfy the following relations: $0<m\leq 10,000,000$, $0<n<10,000,000$, and $0.0001<m/n<100$.

The polyacid copolymer represented by the above Chemical Formula 1 is ion-bounded to and doped to the conductive polymer.

In an implementation, C may be represented by one of the following Chemical Formulae 2 to 5.

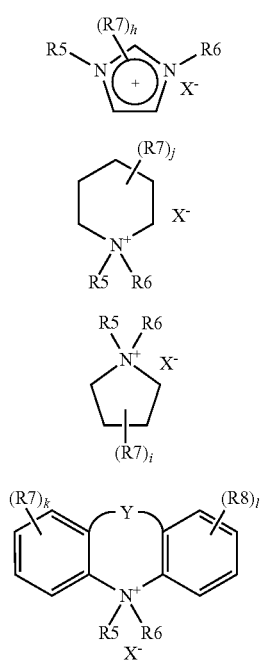

[Chemical Formula 2]

[Chemical Formula 3]

[Chemical Formula 4]

[Chemical Formula 5]

In Chemical Formulae 2 to 5, one of R5 to R8 may be selected from the group of a single bond, a substituted or unsubstituted C1 to C30 alkylene group, a substituted or unsubstituted C1 to C30 heteroalkylene group, a substituted or unsubstituted C1 to C30 alkoxylene group, a substituted or unsubstituted C1 to C30 heteroalkoxylene group, a substituted or unsubstituted C6 to C30 arylene group, a substituted or unsubstituted C6 to C30 arylalkylene group, a substituted or unsubstituted C2 to C30 heteroarylene group, a substituted or unsubstituted C2 to C30 heteroarylalkylene group, a substituted or unsubstituted C5 to C20 cycloalkylene group, and a substituted or unsubstituted C2 to C30 heterocycloalkylene group, and is bound to a main chain of the polyacid copolymer at one end thereof.

Remaining ones of R5 to R8 may each independently be selected from the group of hydrogen, a substituted or unsubstituted C1 to C30 alkyl group, a substituted or unsubstituted C1 to C30 heteroalkyl group, a substituted or unsubstituted C1 to C30 alkoxy group, a substituted or unsubstituted C1 to C30 heteroalkoxy group, a substituted or unsubstituted C6 to C30 aryl group, a substituted or unsubstituted C6 to C30 arylalkyl group, a substituted or unsubstituted C6 to C30 aryloxy group, a substituted or unsubstituted C2 to C30 heteroaryl group, a substituted or unsubstituted C2 to C30 heteroarylalkyl group, a substituted or unsubstituted C2 to C30 heteroaryloxy group, a substituted or unsubstituted C5 to C20 cycloalkyl group, a substituted or unsubstituted C2 to C30 heterocycloalkyl group, a substituted or unsubstituted C1 to C30 alkylester group, a substituted or unsubstituted C1 to C30 heteroalkylester group, a substituted or unsubstituted C6 to C30 arylester group, and a substituted or unsubstituted C2 to C30 heteroarylester group.

X of X$^-$ may be selected from the group of F, Cl, Br, I, BF$_4$, PF$_6$, and $(CnF_{2n+1}SO_2)_2N$ (in which n is a natural number of 1 to about 50). Y may be selected from the group of —CH$_2$—, —CR'R"—, —NH—, —NR'—, —O—, —P—, —P=O—, —S—, and —SiR'R"—, in which R' and R" are each independently selected from the group of hydrogen, a substituted or unsubstituted C1 to C10 an alkyl, a substituted or unsubstituted C6 to C20 aryl, and a substituted or unsubstituted C3 to C20 heteroaryl. h may be an integer of 1 to 3, i may be an integer of 1 to 8, j may be an integer of 1 to 10, k may be an integer of 1 to 4, and l may be an integer of 1 to 4.

When h, i, j, and k are each an integer of greater than or equal to 2, the R7 and/or the R8 substituents may be provided in plural. In an implementation, a plurality of R7 and/or R8 substituents may be the same or different and independent from each other.

In an implementation, the organic ionic salt substituent included in a conductive polymer may prevent phase separation of a conductive polymer composition that will be described below. Thus, the composition may need no separate solvent.

The organic ionic salt substituent may have a dipole moment and thus, may have high polarity and also good solubility in a polar solvent including water and thus, may be well mixed with a conductive polymer composition. Accordingly, an organic photoelectric device using the organic ionic salt substituent may have a long life-span.

In addition, the conductive polymer composition including the conductive polymer having the organic ionic salt substituent may be well dissolved in a polar organic solvent or moisture. Thus, the conductive polymer composition may not only prevent damage on an organic layer neighboring therewith, e.g., an emission layer, formed using a non-polar solvent when applied to a photoelectric device but also use other polar organic solvents.

The conductive polymer may include any suitable conductive polymers used in an organic photoelectric device. For example, the conductive polymer may include a polymer which is obtained by polymerizing one selected from the group of a monomer of polyphenylene, polyphenylenevinylene, polyaniline, or a derivative thereof represented the following Chemical Formula 6; a monomer of pyrrole represented by the following Chemical Formula 7, a monomer of thiophene or a derivative thereof. In an implementation, the conductive polymer may include polythiophene.

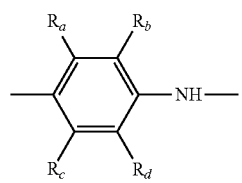

[Chemical Formula 6]

[Chemical Formula 7]

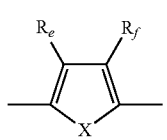

In Chemical Formulae 6 and 7, X may be NH; or a heteroatom such as N, O, S, or P bound to a C1 to C20 alkyl group or a C6 to C20 aryl group. Ra, Rb, Rc, and Rd may each independently be hydrogen; a C1 to C30 alkyl group; a C1 to C30 heteroalkyl group; a C1 to C30 alkoxy group; a C1 to C30 heteroalkoxy group; a C6 to C30 aryl group; a C6 to C30 arylalkyl group; a C6 to C30 aryloxy group; a C6 to C30 arylamine group; a C6 to C30 pyrrole group; a C6 to C30 thiophene group; a C2 to C30 heteroaryl group; a C2 to C30 heteroarylalkyl group; a C2 to C30 heteroaryloxy group; a C5 to C20 cycloalkyl group; a C2 to C30 heterocycloalkyl group; a C1 to C30 alkylester group; a C1 to C30 heteroalkylester group; a C6 to C30 arylester group; and/or a C2 to C30 heteroarylester group. Re and Rf may each independently be NH; or a heteroatom such as N, O, S, or P bound to a C1 to C20 alkyl group, or a C6 to C20 aryl group; a C1 to C30 alkyl group; a C6 to C30 aryl group; a C1 to C30 alkoxy group; a C1 to C30 heteroalkyl group; a C1 to C30 heteroalkoxy group; a C6 to C30 arylalkyl group; a C6 to C30 aryloxy group; a C6 to C30 arylamine group; a C6 to C30 pyrrole group; a C6 to C30 thiophene group; a C2 to C30 heteroaryl group; a C2 to C30 heteroarylalkyl group; a C2 to C30 heteroaryloxy group; a C5 to C20 cycloalkyl group; a C2 to C30 heterocycloalkyl group; a C1 to C30 alkylester group; a C1 to C30 heteroalkylester group; a C6 to C30 arylester group; and/or a C2 to C30 heteroarylester group.

In an implementation, the conductive polymer may be a polymer obtained by polymerizing a compound represented by the following Chemical Formula 8 (as a monomer).

[Chemical Formula 8]

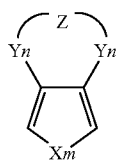

In Chemical Formula 8, X may be NH, or a heteroatom such as N, O, S, or P bound to a C1 to C20 alkyl group or a C6 to C20 aryl group. Y may be NH, or a heteroatom such as N, O, S, or P bound to a C1 to C20 alkyl group or a C6 to C20 aryl group. m and n may each independently be an integer ranging from 0 to 9. Z may be $-(CH_2)_x-CRgRh-(CH_2)_y-$, in which Rg and Rh are each independently selected from H, a C1 to C20 alkyl radical, a C6 to C14 aryl radical, and $-CH_2-ORi$, in which Ri is selected from the group of H, a C1 to C6 alkyl acid a C1 to C6 alkylester, a C1 to C6 heteroalkyl acid, and a C1 to C6 alkylsulfonic acid.

In an implementation, the conductive polymer may include a small amount of residual groups decomposed due to reaction with electrons and a functional group bringing about a morphology change and thus, prevent distribution by the electron, accomplishing high efficiency and long life-span of a photoelectric device.

As used herein, as a substituent, an alkyl group may be linear or branched and may include, e.g., methyl, ethyl, propyl, isobutyl, sec-butyl, tert-butyl, pentyl, iso-amyl, hexyl, or the like, wherein at least one hydrogen of the alkyl group may be substituted with a hydroxy group, a nitro group, a cyano group, an amino group ($-NH_2$, $-NH(R)$, $-N(R')(R'')$, wherein R, R' and R'' are independently a C1 to C10 alkyl group), an amidino group, a hydrazine, or hydrazone group.

As a substituent, a heteroalkyl group may be an alkyl group where one or more carbon atoms of its main chain, e.g., 1 to 5 carbon atoms, are substituted with hetero atom such as an oxygen atom (O), a sulfur atom (S), a nitrogen atom (N), a phosphorus atom (P), or the like.

As a substituent, an aryl group may refer to carbocyclic aromatic molecules including at least one aromatic cycle, and the cycle(s) may be bound as a pendent group or fused.

Examples of the aryl group may include an aromatic group such as phenyl, naphthyl, tetrahydronaphthyl, or the like, and at least one hydrogen atom of the aryl group may be substituted as in the alkyl group.

As a substituent, a heteroaryl group may refer to a 5-membered to 30-membered cyclic aromatic group including one to three hetero atoms selected from N, O, P, or S, and remaining carbon atoms, wherein cycles or rings are attached as a pendant or are fused to each other. At least one hydrogen atom of the heteroaryl group may be substituted as in the alkyl group.

As a substituent, an alkoxy group may include methoxy, ethoxy, propoxy, isobutyloxy, sec-butyloxy, pentyloxy, iso-amyloxy, hexyloxy, or the like, and at least one hydrogen atom of the alkoxy group may be substituted as in the alkyl group.

As a substituent, an arylalkyl group may be an aryl group where a part of hydrogen atoms may be substituted with a lower alkyl, e.g., a radical such as methyl, ethyl, propyl, and the like. Examples of the arylalkyl group may include benzylmethyl, phenylethyl, and the like. At least one hydrogen atom of the arylalkyl group may be substituted as in the alkyl group.

As a substituent, a heteroarylalkyl group may be a heteroaryl group where a part of hydrogen atoms are substituted with a lower alkyl. Heteroaryl of the heteroarylalkyl group is defined as described above. At least one hydrogen atom of the heteroarylalkyl group may be substituted as in the alkyl group.

As a substituent, an aryloxy group may be an aryl radical bound to an oxygen atom, wherein aryl is the same as described above. Examples of aryloxy group may include phenoxy, naphthoxy, anthracenyloxy, phenanthrenyloxy, fluorenyloxy, indenyloxy, and the like, and at least one hydrogen atom of the aryloxy group may be may be substituted as in the alkyl group.

As a substituent, a heteroaryloxy group may refer to a heteroaryl radical bound to an oxygen atom, wherein the heteroaryl is the same as defined above. At least one hydrogen atom of the heteroaryloxy group may be substituted as in the alkyl group.

As a substituent, a cycloalkyl group may refer to a C5 to C30 monovalent monocyclic system. At least one hydrogen atom of the cycloalkyl group may be substituted as in the alkyl group.

As a substituent, a heterocycloalkyl group may refer to a 5-membered to 30-membered monocyclic group including one to three hetero atoms selected from N, O, P, or S. At least one hydrogen atom of the cycloalkyl group may be substituted as in the alkyl group.

As a substituent, an amino group may be $-NH_2$, $-NH(R)$ or $-N(R')(R'')$, wherein R, R', and R'' are each independently a C1 to C10 alkyl group.

As a substituent, a halogen may refer to fluorine, chlorine, bromine, iodine, or astatine, and fluorine may be particularly preferable.

The conductive polymer according to an embodiment may include the polyacid copolymer represented by the above Chemical Formula 1 doped to the above described conductive polymer by an ionic bond.

In an implementation, the conductive polymer may be dispersed into a solvent to prepare a conductive polymer composition. The conductive polymer composition may be used to form a conductive polymer layer.

The composition is defined as a conductive polymer composition, and the conductive polymer composition may further include all of the components such as an organic ionic salt, a physical cross-linking agent, and a chemical cross-linking agent other than a solvent or optionally the components.

The solvent included in the conductive polymer composition according to an embodiment may include any suitable solvent capable of dissolving the conductive polymer. In an implementation, the solvent may include at least one solvent selected from the group of water, alcohols, dimethyl formamide (DMF), dimethylsulfoxide, toluene, xylene, and chlorobenzene.

In an implementation, the conductive polymer composition may further include a cross-linking agent to help improve cross-linking capability of a conductive polymer. The cross-linking agent may include a physical cross-linking agent and/or chemical cross-linking agent.

The physical cross-linking agent may play a role of cross-linking polymer chains and may include a low molecular weight or a polymer compound including a hydroxy group (—OH). Examples of the physical cross-linking agent may include a low molecular weight compound such as glycerol, butanol, and the like, a polymer compound such as polyvinyl alcohol, polyethyleneglycol, and the like, polyethyleneimine, polyvinylpyrrolidone, and the like.

The physical cross-linking agent may be included in the composition in an amount of about 0.001 to about 5 parts by weight, based on 100 parts by weight of the conductive polymer. In an implementation, the physical cross-linking agent may be included in an amount of about 0.1 to about 3 parts by weight.

When the physical cross-linking agent is included within the range, it may have efficient performance and effectively maintain thin film morphology of a conductive polymer layer.

The chemical cross-linking agent may play a role of cross-linking polymer chains and may bring about in-situ polymerization and may form an interpenetrating polymer network (IPN).

The chemical cross-linking agent may include a silane-based material, e.g., tetraethyloxysilane (TEOS). In an implementation, the chemical cross-linking agent may include, e.g., polyaziridine, a melamine-based material, and/or an epoxy-based material.

The chemical cross-linking agent may be included in the composition in an amount of about 0.001 to about 50 parts by weight, based on 100 parts by weight of the conductive polymer including the organic ionic salt. In an implementation, the chemical cross-linking agent may be included in the composition in an amount of about 1 to about 10 parts by weight.

When the chemical cross-linking agent is included within the range, it may have effective performance and may have no large influence on a conductive polymer, sufficiently maintaining conductivity.

When the conductive polymer composition is formed into a conductive polymer layer, a solvent included in the composition may be mostly removed.

The embodiments provide a conductive polymer layer prepared using the conductive polymer composition. The embodiments also provide an organic photoelectric device including the conductive polymer layer. The photoelectric device may be a device using photoelectric effect such as an organic electric field light emitting device, an organic solar cell, an organic transistor, and an organic memory device.

Hereinafter, a case in which the conductive polymer composition according to an embodiment is applied to an organic electric field light emitting device is described.

In the organic electric field light emitting device, the conductive polymer composition may be used to form a charge injection layer, e.g., a hole or electron injection layer (EIL). A light emitting intensity and efficiency of the organic electric field light emitting device may be increased by uniformly and efficiently injecting holes and electrons.

Also, in the case of an organic solar cell, the conductive polymer layer of an embodiment may be used as an electrode or an electrode buffer layer to thereby increase quantum efficiency. In the case of an organic transistor, it can be used as an electrode material in a gate or source-drain electrode.

Of the organic photoelectric devices, a structure of an organic electric field light emitting device and a method of manufacturing the same using the conductive polymer layer composition will be described.

FIGS. 1A to 1D illustrate schematic cross-sectional views of stacking structures of the organic electric field light emitting devices according to embodiments.

The organic electric field light emitting device of FIG. 1A includes a light emission layer 12 above a first electrode 10, a hole injection layer (HIL) 11 (including the conductive polymer layer according to an embodiment) between the first electrode 10 and the light emission layer 12, a hole blocking layer (HBL) 13 on the light emission layer 12, and a second electrode 14 on the hole blocking layer (HBL) 13. The hole injection layer (HIL) 11 may be referred to as a buffer layer.

Figure 1B:
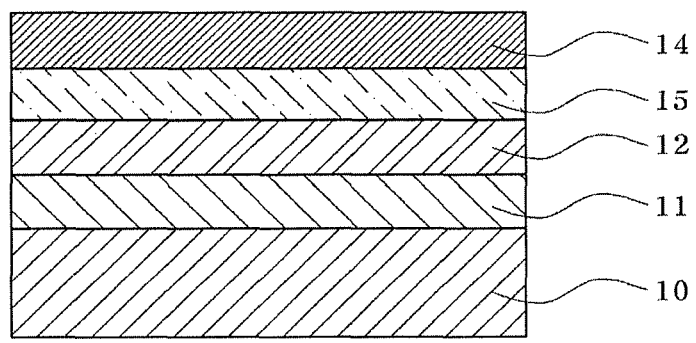

The organic electric field light emitting device of FIG. 1B has the same stacking structure as that of FIG. 1A, except that an electron transport layer (ETL) is provided on the light emission layer 12, instead of the hole blocking layer (HBL) 13.

Figure 1C:
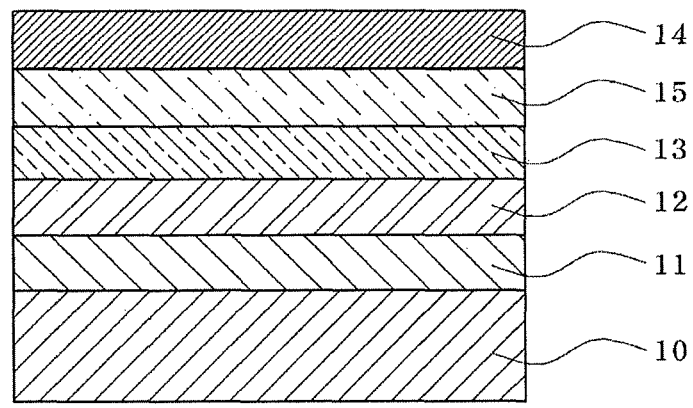

The organic electric field light emitting device of FIG. 1C has the same stacking structure as that of FIG. 1A, except that a dual layer of the hole blocking layer (HBL) 13 and the electron transport layer (ETL) 15 sequentially stacked therein is on the light emission layer 12.

Figure 1D:
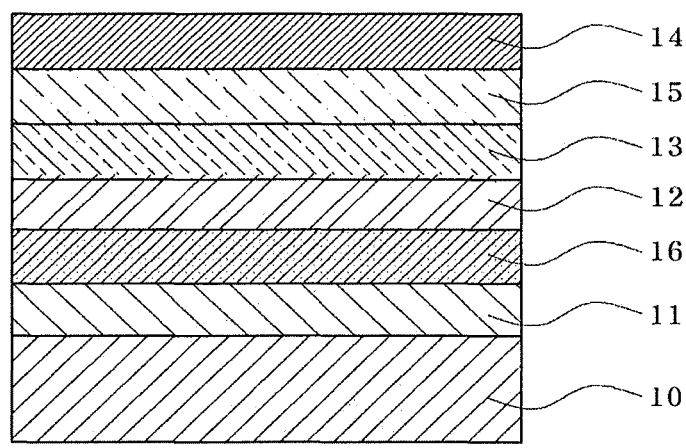

The organic electric field light emitting device of FIG. 1D has the same structure as that of FIG. 1C, except that a hole transport layer (HTL) 16 is provided between the hole injection layer (HIL) 11 and the light emission layer 12. In an implementation, the hole transport layer (HTL) 16 may help suppress permeation of impurities from the hole injection layer (HIL) 11 to the emission layer 12.

The organic electric field light emitting device having the stacking structure of FIGS. 1A to 1D may be fabricated through a suitable fabrication method.

First, a patterned first electrode 10 may be formed on a substrate (not shown).

The substrate may be a suitable substrate for an organic electric field light emitting device, e.g., a glass substrate or a transparent plastic substrate having excellent general transparency, surface smoothness, handling ease, and water repellency. The substrate may have a thickness of about 0.3 to about 1.1 mm.

Materials for forming the first electrode 10 are not specifically limited. When the first electrode 10 is a cathode, the cathode may be formed using conductive metals or oxides thereof that easily performs hole injection. Examples of the materials may include indium tin oxide (ITO), indium zinc oxide (IZO), nickel (Ni), platinum (Pt), gold (Au), iridium (Ir), and the like.

The substrate including the first electrode 10 thereon may be cleaned and may be subjected to UV ozone treatment. An organic solvent, e.g., isopropanol (IPA), acetone, or the like, may be used for the cleaning process.

The hole injection layer (buffer layer) 11 may be formed on the first electrode 10 of the cleaned substrate. The hole injection layer (buffer layer) 11 may include the conductive polymer composition of an embodiment.

The hole injection layer 11 may help reduce contact resistance between the first electrode 10 and the light emission layer 12, and at the same time may help improve hole transfer capability of the first electrode 10 toward the light emission layer 12. Thus, the driving voltage and life-span characteristics of the device may be generally improved.

The hole injection layer 11 may be formed by dissolving the conductive polymer of an embodiment to thereby prepare a composition, spin-coating an upper part of the first electrode 10 with the prepared composition, and drying the composition.

In an implementation, a thickness of the hole injection layer 11 may be, e.g., about 5 to about 200 nm. In an implementation, the thickness may be, e.g., about 20 to about 100 nm.

When the thickness of the hole injection layer 11 falls in the range, hole injection may be sufficiently performed, and light transmission may be maintained at a good level.

A light emission layer 12 may be disposed on the hole injection layer 11. The light emission layer material is not specifically limited. Examples of the light emission layer material may include an oxadiazole dimer dye (Bis-DAPOXP), spiro compounds (Spiro-DPVBi, Spiro-6P), tri-arylamine compounds, bis(styryl)amine (DPVBi, DSA), Flrpic, CzTT, anthracene, TPB, PPCP, DST, TPA, OXD-4, BBOT and AZM-Zn (blue-emitting), coumarin 6, C545T, quinacridone, and Ir(ppy)$^3$ (green-emitting), DCM 1, DCM2, Eu(thenoyltrifluoroacetone)3 (Eu(TTA)$^3$ and butyl-6-(1,1,7, 7-tetramethyljulolidyl-9-enyl)-4H-pyran (DCJTB) (red-emitting), and the like.

In addition, polymer light emitting materials may be used. The polymer light emitting materials may include polymers, e.g., phenylene-based, phenylene vinylene-based, thiophene-based, fluorine-based, and/or spiro-fluorene-based polymers or nitrogen-included aromatic compounds.

The light emission layer 12 may have a thickness of, e.g., about 10 to about 500 nm. In an implementation, the light emission layer 12 may have a thickness of, e.g., about 50 to about 120 nm. When the thickness of the light emission layer 12 falls in the range, leakage current amount and driving voltage increase may be appropriately maintained, thereby effectively increasing the life-span.

A dopant may be added to the composition for forming the light emission layer. An amount of the dopant may vary according to material used for forming the light emission layer. In an implementation, the dopant may be included in an amount of about 30 to about 80 parts by weight, based on 100 parts by weight of the material for forming a light emission layer (i.e., a total weight of host and dopant).

When the content of the dopant falls in the range, the light emitting characteristics of the EL device can be effectively maintained. Examples of the dopant may include an arylamine, peryl-based compounds, pyrrole-based compounds, hydrazone-based compounds, carbazole-based compounds, stilbene-based compounds, starburst-based compounds, and oxadiazole-based compounds.

In an implementation, a hole transport layer (HTL) 16 may be formed between the hole injection layer (HIL) 11 and the light emission layer 12. A material for forming the hole transport layer (HTL) 16 is not specifically limited. In an implementation, the material for forming the hole transport layer (HTL) 16 may include at least one selected from the group of compounds including a carbazole and/or an arylamine (which transport holes), phthalocyanine-based compounds, and triphenylene derivatives.

Examples of materials for forming the hole transport layer (HTL) 16 may include at least one material selected from the group of 1,3,5-tricarbazolylbenzene, 4,4'-biscarbazolylbiphenyl, polyvinylcarbazole, m-biscarbazolylphenyl, 4,4'-biscarbazolyl-2,2'-dimethylbiphenyl, 4,4',4"-tri(N-carbazolyl) triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4,4'diamine (TPD), N,N'-di (naphthalen-1-yl)-N,N'-diphenyl benzidine (α-NPD), N,N'-diphenyl-N,N'-bis(1-naphthyl)-(1,1'-biphenyl)-4,4'-diamine (NPB), IDE320 (Idemitsu Kosan Co., Ltd.), poly(9,9-dioctylfluorene-co-N-(4-butylphenyl)diphenylamine) (TFB), and poly(9,9-dioctylfluorene-co-bis-(4-butylphenyl-bis-N, N-phenyl-1,4-phenylene diamine (PFB).

The hole transport layer 16 may have a thickness of, e.g., about 1 to about 100 nm. In an implementation, the hole transport layer 16 may have a thickness of, e.g., about 5 to about 50 nm. When the thickness of the hole transport layer 16 falls in the range, the hole transport layer 16 may maintain sufficient hole transport capability as well as an appropriate level of driving voltage.

A hole blocking layer 13 and/or an electron transport layer 15 may be disposed on the light emission layer 12 through a deposition or spin coating method. The hole blocking layer 13 may help prevent excitons formed in a light emitting material from transferring to the electron transport layer 15 and/or may help prevent holes from transferring to the electron transport layer 15.

Examples of a material for forming the hole blocking layer 13 may include a phenanthroline-based compound represented by the following Chemical Formula 9 (e.g., BCP of the UDC Company), an imidazole-based compound represented by the following Chemical Formula 10, a triazole-based compound represented by the following Chemical Formula 11, an oxadiazole-based compound (e.g., a commercial product PBD) represented by the following Chemical Formula 12, an aluminum complex represented by the following Chemical Formula 13 (UDC Company), and the like.

The hole blocking layer may have a thickness of, e.g., about 5 nm to about 100 nm. The electron transport layer may have a thickness of, e.g., about 5 nm to about 100 nm. When the thicknesses of the hole blocking layer and electron transport layer are within the above range, electron transport or hole blocking performance may be sufficient.

[Chemical Formula 9]

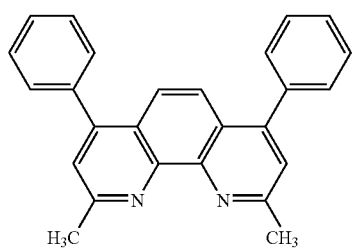

[Chemical Formula 10]

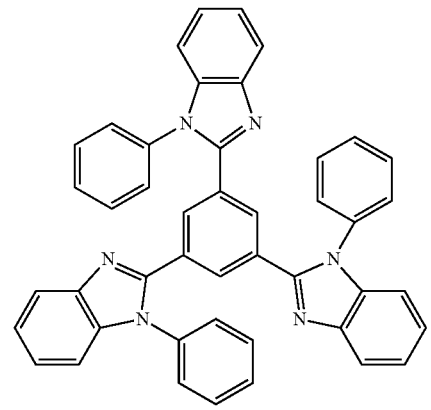

[Chemical Formula 11]

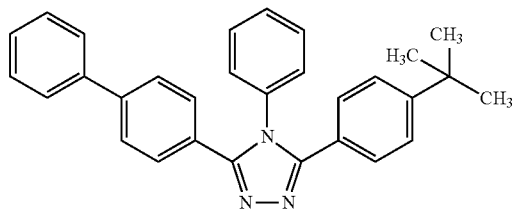

[Chemical Formula 12]

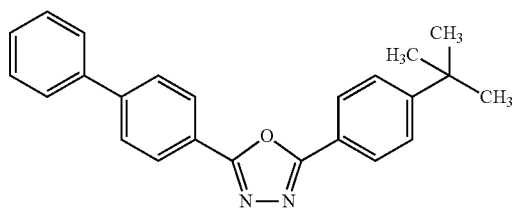

[Chemical Formula 13]

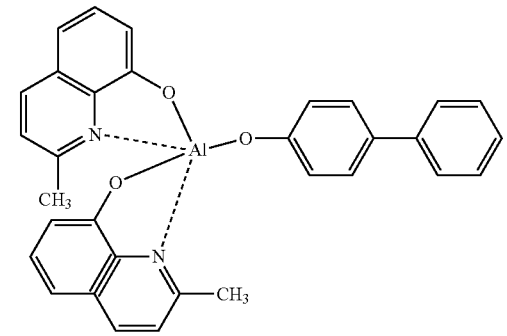

represented by the following Chemical Formula 14, aluminum complexes (Alq$_3$ (tris(8-quinolinolato)-aluminum)) represented by the following Chemical Formula 15, BAlq represented by the following Chemical Formula 16, SAlq represented by the following Chemical Formula 17, Almq3 represented by the following Chemical Formula 18, a gallium complex (Gaq'2OPiv) represented by the following Chemical Formula 19, Gaq'2OAc represented by the following Chemical Formula 20, 2(Gaq'2) represented by the following Chemical Formula 21, or the like.

[Chemical Formula 14]

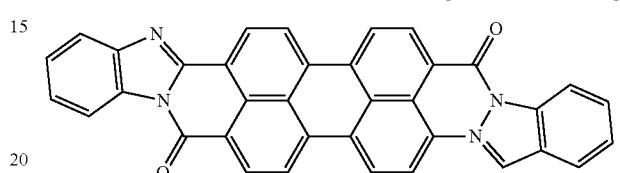

[Chemical Formula 15]

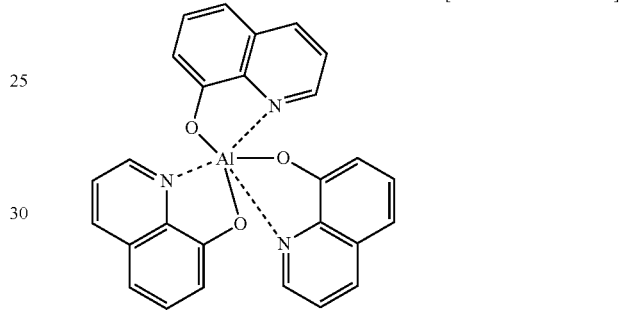

[Chemical Formula 16]

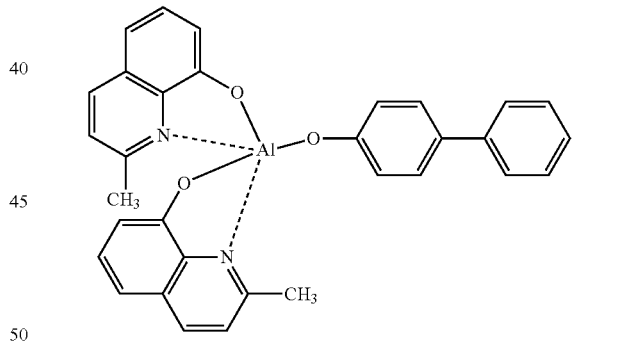

[Chemical Formula 17]

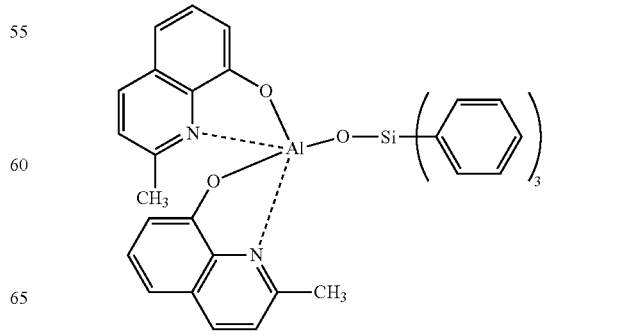

The electron transport layer ETL 15 may include, e.g., a material selected from oxazole-based compounds, iso-oxazole-based compounds, triazole-based compounds, isothiazole-based compounds, oxadiazole-based compounds, thiadiazole-based compounds, perylene-based compounds

[Chemical Formula 18]

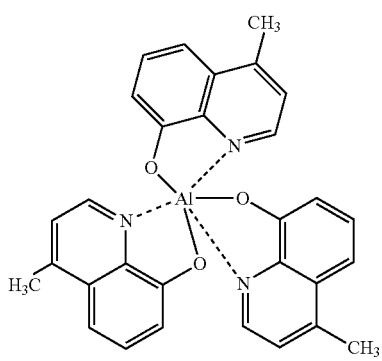

[Chemical Formula 19]

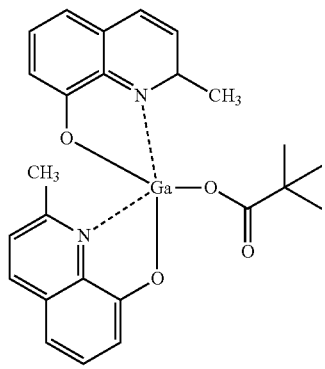

[Chemical Formula 20]

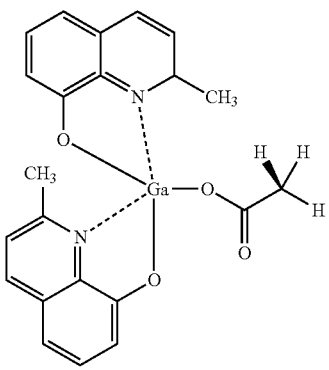

[Chemical Formula 21]

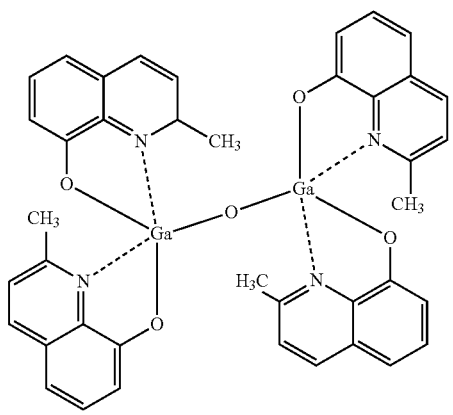

The second electrode 14 may be disposed on the stacking structure fabricated as above, and the resulting structure may be sealed to thereby complete the fabrication of an organic electric field light emitting device.

Materials for forming the second electrode 14 are not specifically limited. For example, the materials may include metals with a small work function, such as Li, Cs, Ba, Ca, Ca/Al, LiF/Ca, LiF/Al, BaF2/Ca, Mg, Ag, Al, or alloys thereof, or multi-layers thereof. The second electrode 14 may have a thickness of about 50 to about 3,000 Å.

The fabrication of an organic electric field light emitting device may use any suitable apparatus or method, and the organic electric field light emitting device according to an embodiment may be fabricated through a method of fabricating an organic electric field light emitting device using a typical conductive polymer composition.

Hereinafter, exemplary embodiments are illustrated to show that a conductive polymer may help suppress moisture absorption, may help decrease a concentration of polyacid in a molecule and agglomeration among molecules and thus, may help accomplish excellent thin film characteristic and storage stability as well as may help improve efficiency and life-span of an organic photoelectric device.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect

EXAMPLE 1

Preparation of Ionic Salt Represented by Chemical Formula I-1

[Reaction Scheme 1]

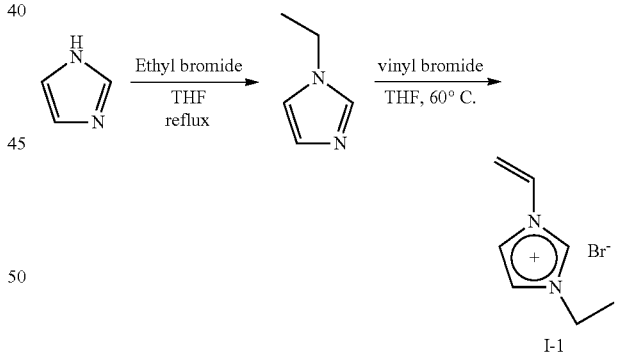

10 g of ethyl bromide made by Sigma-Aldrich Co., Ltd. and 6 g of imidazole were put in 100 mL of THF under a nitrogen atmosphere, and the mixture was agitated for 8 hours. The reactant was extracted with dichloromethane and washed with water four times. The extracted solution was treated with anhydrous magnesium sulfate to remove extra moisture therefrom. Then, the reactant was filtered, and a solvent was removed therefrom using a rotary evaporator. The resulting product was absorbed in alumina powder and then, developed with dichloromethane, preparing 7 g of yellow liquid N-ethylimidazole.

7 g of the N-ethylimidazole was dissolved in 60 mL of THF, and 9 g of vinyl bromide was added thereto in a dropwise fashion. The mixture was agitated at 60° C. for about 8 hours and concentrated under a reduced pressure to remove excess vinyl bromide and a solvent therefrom. The resulting reactant was treated through an alumina gel column and with dichloromethane, obtaining 13 g of desired yellow liquid I-1.

Element analysis: calc. C, 41.40; H, 5.46; N, 13.79
found C, 41.37; H, 5.42; N, 13.81

EXAMPLE 2

Preparation of Ionic Salt Represented by Chemical Formula I-2

[Reaction Scheme 2]

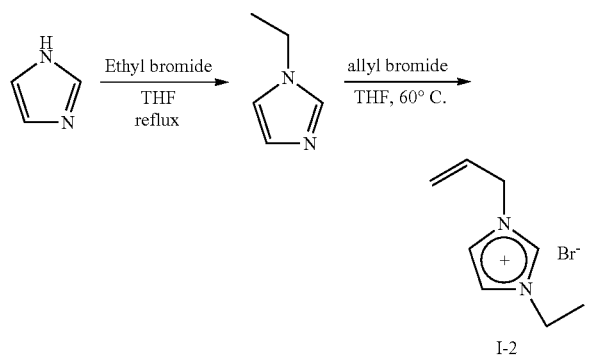

I-2

10 g of ethyl bromide made by Sigma-Aldrich Co., Ltd. and 6 g of imidazole were put in 100 mL of THF under a nitrogen atmosphere. The mixture was agitated for 8 hours. The reactant was extracted with dichloromethane and washed with water four times. The extracted solution was treated with anhydrous magnesium sulfate to remove extra moisture therefrom and filtered, and a solvent was removed therefrom using a rotary evaporator. The resulting reactant was absorbed in alumina powder and developed with dichloromethane, obtaining 7 g of light yellow liquid N-ethylimidazole.

7 g of the N-ethylimidazole was dissolved in 60 mL of THF, and 10 g of allyl bromide was added thereto in a dropwise fashion. The mixture was agitated at 60° C. for about 8 hours and concentrated under a reduced pressure to remove excess allyl bromide and a solvent therefrom. The resulting reactant was treated through an alumina gel column and with dichloromethane, obtaining 15 g of light yellow liquid I-2.

Element analysis: calc. C, 44.26; H, 6.04; N, 12.90
found C, 44.30; H, 5.99; N, 12.88

EXAMPLE 3

Preparation of Ionic Salt Represented by Chemical Formula I-3

[Reaction Scheme 3]

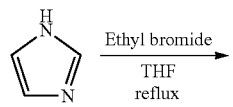

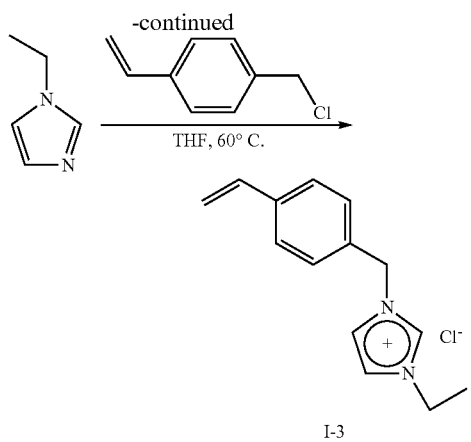

I-3

10 g of ethyl bromide made by Sigma-Aldrich Co., Ltd. and 6 g of imidazole were put in 100 mL of THF under a nitrogen atmosphere, and the mixture was agitated for 8 hours. The reactant was extracted with dichloromethane and washed with water four times. The extracted solution was treated with anhydrous magnesium sulfate to remove extra moisture therefrom and filtered, and a solvent was removed therefrom using a rotary evaporator. The resulting reactant was absorbed in alumina powder and developed with dichloromethane, obtaining 7 g of light yellow liquid N-ethylimidazole.

7 g of the N-ethylimidazole was dissolved in 60 mL of THF, and 10 g of 4-vinylbenzyl chloride was added thereto in a dropwise fashion. The mixture was agitated at 60° C. for about 8 hours and concentrated under a reduced pressure to remove excess 4-vinylbenzyl chloride and a solvent therefrom. The resulting reactant was treated through an alumina gel column and with dichloromethane, obtaining 15 g of light yellow liquid I-3 with high viscosity.

Element analysis: calc. C, 44.26; H, 6.04; N, 12.90
found C, 44.30; H, 5.99; N, 12.88

EXAMPLE 4

Preparation of Ionic Salt Represented by Chemical Formula I-4

[Reaction Scheme 4]

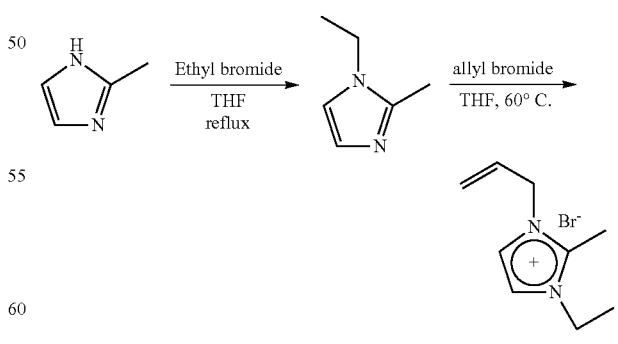

I-4

9.5 g of ethyl bromide made by Sigma-Aldrich Co., Ltd. and 6 g of 2-methylmidazole were put in 100 mL of THF under a nitrogen atmosphere, and the mixture was agitated for 8 hours. The reactant was extracted with dichloromethane and washed with water four times. The extracted solution was treated with anhydrous magnesium sulfate to remove extra moisture therefrom, and a solvent was removed therefrom using a rotary evaporator. The reactant was absorbed in alumina powder and developed with dichloromethane, obtaining 7 g of light yellow liquid 2-methyl-N-ethylimidazole.

7 g of the N-ethylimidazole was dissolved in 60 mL of THF, and 10 g of allyl bromide was added thereto in a dropwise fashion. The mixture was agitated at 60° C. for about 8 hours and concentrated under a reduced pressure to remove excess allyl bromide and a solvent. The resulting reactant was treated through an alumina gel column and with dichloromethane, obtaining 15 g of light yellow liquid I-4 with a high viscosity.

Element analysis: calc. C, 44.77; H, 6.54; N, 12.12 found C, 44.73; H, 6.59; N, 12.14

EXAMPLE 5

Preparation of Ionic Salt Represented by Chemical Formula I-5

[Reaction Scheme 5]

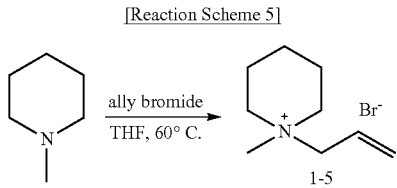

5 g of N-methylpiperidine was dissolved in 60 mL of THF, and 8 g of allyl bromide was added thereto in a dropwise fashion. The mixture was agitated at 60° C. for about 8 hours and concentrated under a reduced pressure to remove excess allyl bromide and a solvent. The resulting reactant was treated through an alumina gel column and with dichloromethane, obtaining 12 g of light yellow liquid 1-5 with high viscosity.

EXAMPLE 6

Preparation of Ionic Salt Represented by Chemical Formula I-1-A

The ionic salt I-1 according to Example 1 was treated with lithium bis(trifluoromethane)sulfonamide and/or lithium bis(trifluoromethanesulfonyl)imide (LiTFSI(LiN($SO_2CF_3$)$_2$)) to transfer or replace a halogen anion to or with $^-$N(($SO_2CF_3$)$_2$. The transfer process was as follows.

10 mmol of the ionic salt was dissolved in 300 mL of acetone in a 500 mL round-bottomed flask, and 10 mmol of LiTFSI made by Fluorochem Inc. was added thereto in a dropwise fashion. The mixture was agitated for about 3 hours. The produced white powder was filtered and removed, and the reactant dissolved in a solvent was concentrated under a reduced pressure, obtaining a light yellow liquid. The light yellow liquid was treated through an alumina gel column and with dichloromethane, obtaining a light liquid substituted with an anion and having high viscosity, a compound represented by Chemical Formula I-1-A.

EXAMPLE 7

Preparation of Ionic Salt Represented by Chemical Formula I-2-A

Ionic salt I-2-A was prepared according to the same method as Example 6 except for using the ionic salt I-2 according to Example 2 instead of the ionic salt I-1 according to Example 1.

EXAMPLE 8

Preparation of Ionic Salt Represented by Chemical Formula I-3-A

Ionic salt I-3-A was prepared according to the same method as Example 6 except for using the ionic salt I-3 according to Example 2 instead of the ionic salt I-1 according to Example 1.

EXAMPLE 9

Preparation of Ionic Salt Represented by Chemical Formula I-4-A

Ionic salt I-4-A was prepared according to the same method as Example 6 except for using the ionic salt I-4 according to Example 2 instead of the ionic salt I-1 according to Example 1.

Each ionic salt prepared according to Examples 6 to 9 were represented by the following Chemical Formulae 23 to 26.

[Chemical Formula 23]

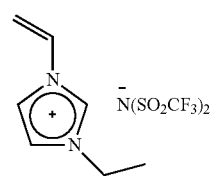

I-1-A

[Chemical Formula 24]

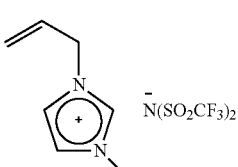

I-2-A

[Chemical Formula 25]

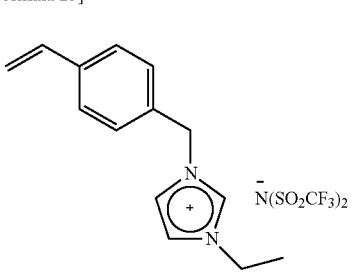

I-3-A

[Chemical Formula 26]

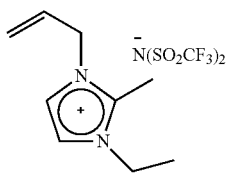

I-4-A

EXAMPLE 10

Synthesis of Doped Polymer

Step 1: Synthesis of Copolymer 12 g of sodium styrenesulfonate (SSNa) (Sigma Aldrich Co., Ltd.) and 3 g of the ionic salt I-1-A (in an amount of 12.7 mol % based on the entire weight of sodium styrenesulfonate (SSNa)) were heated and completely dissolved in 250 mL of dimethylsulfoxide (DMSO). Next, a solution prepared by dissolving 0.3 g of azobisisobutyronitrile (AIBN) in dimethylsulfoxide (DMSO) was added to the above solution in a dropwise fashion and polymerized for greater than or equal to 48 hours.

The obtained reactant was precipitated with acetone, allowed to stand at a room temperature, and filtered, obtaining a copolymer. The copolymer had a polymer mole ratio of 8:1, Mn=24,000, and Mw=12,100.

Step 2: Acidification and NaCl Removal, and Polymer Purification

[Chemical Formula 27]

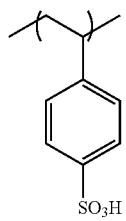

[Chemical Formula 28]

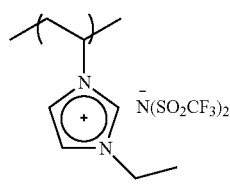

The copolymer obtained in Step 1 was developed a using cation-based resin Amberite® IR-120 column, which was activated with H$^+$, obtaining a copolymer including repeating units represented by Chemical Formulae 27 and 28. After this process was repeated at least three times, NaCl salts produced therein and remaining in a small amount were sufficiently removed a Prep/Scale® TFF membrane made by Millipore Co., obtaining a purer copolymer including repeating units of Chemical Formulae 27 and 28. Herein, the obtained doped polymer had the same mole ratio as in Step 1. The copolymer had molecular weights as follows: Mn=23,600 and Mw=12,700.

EXAMPLE 11

Synthesis of Doped Polymer

Step 1: Synthesis of Copolymer 12 g of sodium styrenesulfonate (SSNa) (Sigma Aldrich Co., Ltd.) and 3 g of the ionic salt I-2-A (in an amount of 12.3 mol % based on the amount of the sodium styrenesulfonate (SSNa)) were heated and completely dissolved in 250 mL of dimethylsulfoxide (DMSO). Next, the solution was added to a solution prepared by dissolving 0.3 g of azobisisobutyronitrile (AIBN) in dimethylsulfoxide (DMSO) in a dropwise fashion and then, polymerized for greater than or equal to 48 hours.

The obtained reactant was precipitated with acetone, allowed to stand at a room temperature, and filtered, obtaining a copolymer. The copolymer had a polymer mole ratio of 8:1, Mn=23,500, and Mw=10,100.

Step 2: Acidification, NaCl Removal, and Polymer Purification

[Chemical Formula 27]

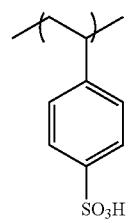

[Chemical Formula 29]

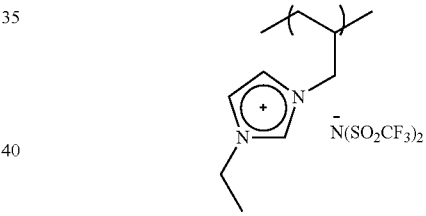

The copolymer obtained in the first step was developed using a cation-based resin Amberite® IR-120 column, which was activated with H$^+$, obtaining a copolymer including repeating units of Chemical Formulae 27 and 29. After this process was repeated at least three times, NaCl salts produced therein and remaining in a small amount were sufficiently removed, obtaining a purer copolymer including repeating units of Chemical Formulae 27 and 29. The obtained doped polymer had the same mole ratio as in Step 1. The copolymer had molecular weights as follows: Mn=23,600 and Mw=11,000.

EXAMPLE 12

Synthesis of Doped Polymer

Step 1: Synthesis of Copolymer 12 g of sodium styrenesulfonate (SSNa) (Sigma Aldrich Co. Ltd.) and 3 g of the ionic salt I-3-A (in an amount of 12.3 mol % based on the amount of sodium styrenesulfonate (SSNa)) were heated and completely dissolved in 250 mL of dimethylsulfoxide (DMSO). Next, a solution prepared by dissolving 0.3 g of azobisisobutyronitrile (AIBN) in dimethylsulfoxide (DMSO) was added to the solution in a dropwise fashion and polymerized for greater than or equal to 48 hours.

The obtained reactant was precipitated with acetone, allowed to stand at a room temperature, and filtered, obtaining a copolymer. The copolymer had a polymer mole ratio of 8:1, Mn=23,500, and Mw=10,100.

Step 2: Acidification, NaCl removal, and polymer purification

[Chemical Formula 27]

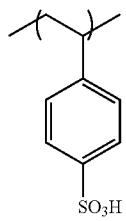

[Chemical Formula 30]

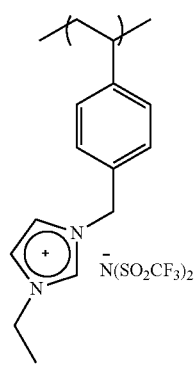

The copolymer obtained in the first step was developed using a cation-based resin Amberite® IR-120 column, which was activated with H+, obtaining a copolymer including repeating units of Chemical Formulae 27 and 30. After the process was repeated at least 3 times, NaCl salts produced therein and remaining in a small amount were sufficiently removed using a Prep/Scale® TFF membrane made by Millipore Co., obtaining a purer copolymer including repeating of Formulae 27 and 30. The obtained doped polymer had the same mole ratio as in Step 1. The copolymer had molecular weights as follows: Mn=23,600 and Mw=11,000.

EXAMPLE 13

Synthesis of Doped Polymer

Step 1: Synthesis of Copolymer 12 g of sodium styrenesulfonate (SSNa) (Sigma Aldrich Co., Ltd.) and 3.1 g of the ionic salt I-4-A (in an amount of 12.3 mol % based on the amount of the sodium styrenesulfonate (SSNa)) were heated and completely dissolved in 250 mL of dimethylsulfoxide (DMSO). Next, a solution prepared by dissolving 0.3 g of azobisisobutyronitrile (AIBN) in dimethylsulfoxide (DMSO) was added to the solution in a dropwise fashion and polymerized for greater than or equal to 48 hours.

The obtained reactant was precipitated with acetone, allowed to stand at a room temperature, and filtered, obtaining a copolymer. The copolymer had a polymer mole ratio of 8:1, Mn=22,100, and Mw=10,500.

Step 2: Acidification, NaCl removal, and polymer purification

[Chemical Formula 27]

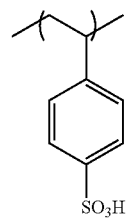

[Chemical Formula 31]

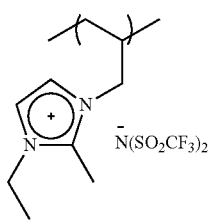

The copolymer obtained in Step 1 was developed using a cation-based resin Amberite® IR-120 column, which was activated with H+, obtaining a copolymer including repeating units of Chemical Formulae 27 and 31. After this process was repeated at least three times, a Prep/Scale® TFF membrane made by Millipore Co. was used to remove NaCl salts produced therein and remaining in a small amount, obtaining a purer copolymer including repeating units of Chemical Formulae 27 and 31. The obtained doped polymer had the same mole ratio as in Step 1. The copolymer had molecular weights as follows: Mn=23,500 and Mw=12,500.

EXAMPLE 14

Fabrication of Organic Photoelectric Device

A 15Ψ/cm² (1,200 Å) ITO glass substrate (Corning Inc.) was cut to be width×length×thickness of 50 mm×50 mm×0.7 mm and ultrasonic wave-cleaned in isopropyl alcohol and pure water for 5 minutes, respectively and UV, ozone-cleaned for 30 minutes.

Then, the conductive polymer compound composition according to Example was spin-coated to form a 50 nm-thick hole injection layer (HIL) on the substrate.

On the hole injection layer (HIL), a 70 nm-thick emission layer was formed of a red light emitting polymer. On the emission layer, a 2 nm LiF layer and a 100 nm Al layer were formed as a second electrode, fabricating an organic photoelectric device.

EXAMPLE 15

Fabrication of Organic Photoelectric Device

An organic photoelectric device was fabricated according to the same method as Example 14 except for using the conductive polymer according to Example 11 instead of the conductive polymer according to Example 10.

EXAMPLE 16

Fabrication of Organic Photoelectric Device

An organic photoelectric device was fabricated according to the same method as Example 14 except for using the conductive polymer according to Example 12 instead of the conductive polymer according to Example 10.

EXAMPLE 17

Fabrication of Organic Photoelectric Device

An organic photoelectric device was fabricated according to the same method as Example 14 except for using the conductive polymer according to Example 13 instead of the conductive polymer according to Example 10.

COMPARATIVE EXAMPLE 1

Fabrication of Organic Photoelectric Device

An organic photoelectric device was fabricated according to the same method as Example 14 except for using a CH8000 conductive polymer made by H.C Storck Ltd. instead of the conductive polymer according to Example 10.

EXPERIMENTAL EXAMPLES

Experiment Method (1) Measurement of Thin Film on the Surface

The copolymers according to Examples 10 to 13 were respectively spin-coated to form a film in a 15×15 µm region on an ITO substrate using XE-100 made by Park system Corp. Then, the 10×10 µm region of the film was measured regarding surface average roughness thereof.

(2) Water Filterability of Copolymer and Conductive Polymer 10 ml of each copolymer according to Examples 10 to 13 was filtered using a 0.45 µm syringe disk filter made of a PVDF material (Millipore Co.)

(3) Efficiency Characteristic of Organic Photoelectric Device

The organic photoelectric devices according to Examples 14 to 17 were measured regarding efficiency in a method of measuring I-V-L using Keithley 2400 (Keithley Instrument Inc.) and CS-1000A (Minolta Co., Ltd.).

Experiment Result

The following Table 1 provides surface status of thin films and water filterability of conductive polymers. As shown in Table 1, the copolymers had excellent water filterability and very low roughness.

TABLE 1

| Samples | Filterability | Roughness (nm) | Conductive polymer |
|---|---|---|---|
| Example 10 | 10 mL | 1.4 | polythiophene |
| Example 11 | 10 mL | 1.3 | polythiophene |
| Example 12 | 10 mL | 1.2 | polythiophene |
| Example 13 | 10 mL | 1.8 | polythiophene |

The following Table 2 provides efficiency characteristic of organic photoelectric devices. As shown in the following Table 2, the organic photoelectric devices of all Examples had better luminous efficiency than Comparative Example 1 and much better electric power efficiency due to low driving voltage than the organic photoelectric device according to Comparative Example 1.

TABLE 2

| | | | Efficiency (at 1000 nit) | | |
|---|---|---|---|---|---|
| Nos. | Samples | Conductive polymer | Driving voltage (Vd) | Luminous efficiency (cd/A) | Electric power efficiency (lm/W) |
| 1 | Example 14 | Example 10 | 6.8 | 5.6 | 2.6 |
| 2 | Example 15 | Example 11 | 6.7 | 6.3 | 2.8 |
| 3 | Example 16 | Example 12 | 6.9 | 6.0 | 2.8 |
| 4 | Example 17 | Example 13 | 7.3 | 6.4 | 2.1 |
| 5 | Comparative Example 1 | CH8000 (H. C Storck) | 7.8 | 4.2 | 1.7 |

By way of summation and review, in order to substantially increase luminance, an electron injection layer (EIL) or a hole injection layer should be introduced to an electrical light emitting assembly.

Many organic compounds may be capable of transferring charges (which are holes and electrons). For example, Baytron-P, which is commercially available in the market and produced by the Bayer AG Company, is a representative organic compound that is capable of transferring charges, and it is soluble and is used to produce organic electro-luminescence (EL). Baytron-P is a kind of PEDOT (poly(3,4-ethylene dioxythiophene))-PSS (poly(4-styrene sulfonate)) aqueous solution.

PEDOT-PSS may be used for fabrication of an organic light emitting diode. For example, PEDOT-PSS may be used to form a hole injection layer (HIL) by spin-coating it on an indium tin oxide (ITO) electrode. The PEDOT-PSS may have a structure as shown in the following Chemical Formula 22.

[Chemical Formula 22]

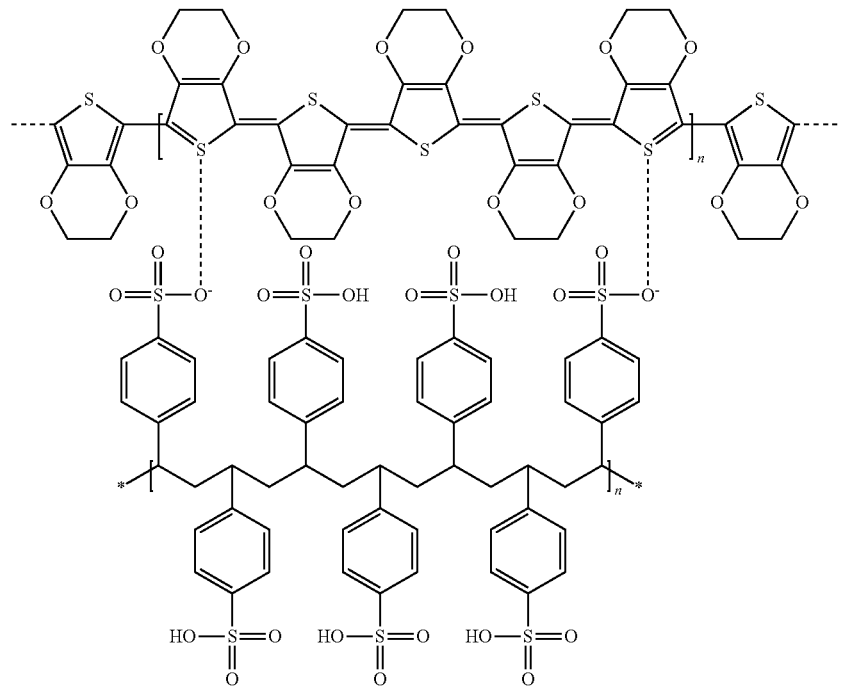

The PEDOT-PSS expressed in the above Chemical Formula 22 is a simple ion composite of a polyacid, which is poly(4-styrene sulfonate) (PSS), and a conductive polymer, which is poly(3,4-ethylenedioxythiophene) (PEDOT). It has a structure in which PEDOT is doped with a water-soluble polyacid.

The PSS may be dedoped by degradation, or a part of the PSS may be decomposed through a reaction with electrons to thereby emit a material such as a sulfate. The emitted material may be diffused into a neighboring organic layer, such as a light emission layer. The diffusion of a material originating from the hole injection layer (HIL) into the light emission layer may cause exciton quenching, to thereby decrease the efficiency and life-span of the organic light emitting diode.

Accordingly, the embodiments provide a conductive polymer that helps improve efficiency and life-span of an organic light emitting diode.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A conductive polymer doped with a polyacid copolymer, the polyacid copolymer being represented by the following Chemical Formula 1:

[Chemical Formula 1]

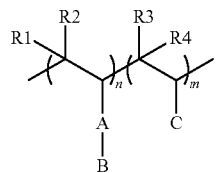

wherein, in Chemical Formula 1,

A is selected from the group of a substituted or unsubstituted C1 to C30 alkylene group; a substituted or unsubstituted C1 to C30 heteroalkylene group; a substituted or unsubstituted C1 to C30 alkoxy group; a substituted or unsubstituted C1 to C30 heteroalkoxy group; a substituted or unsubstituted C6 to C30 arylene group, a substituted or unsubstituted C6 to C30 arylalkylene group, a substituted or unsubstituted C6 to C30 aryloxy group, a substituted or unsubstituted C2 to C30 heteroarylene group, a substituted or unsubstituted C2 to C30 heteroarylalkylene group; a substituted or unsubstituted C2 to C30 heteroaryloxy group; a substituted or unsubstituted C5 to C20 cycloalkylene group; a substituted or unsubstituted C2 to C30 heterocycloalkylene group; a substituted or unsubstituted C1 to C30 alkyleneester group; a substituted or unsubstituted C1 to C30 heteroalkyleneester group; a substituted or unsubstituted C6 to C30 aryleneester group; and a substituted or unsubstituted C2 to C30 heteroaryleneester group, B is an ionic group or a group including an ionic group, the ionic group including a pair of a cation and an anion in which the cation is $Na^+$, $K^+$, $Li^+$, $Mg^{2+}$, $Zn^{2+}$, $Al^{3+}$, $H^+$, $NH_3^+$, or an organic ion of $CH_3(-CH_2-)_n$, in which n is a natural number of 1 to 50, and the anion is $PO_3^-$, $SO_3^-$, $COO^-$, $I^-$, or $CH_3COO^-$, R1 to R4 are each independently selected from the group of hydrogen, a substituted or unsubstituted C1 to C10 alkyl, a substituted or unsubstituted C6 to C20 aryl, and a substituted or unsubstituted C3 to C20 heteroaryl, $0 < m \leq 10,000,000$, $0 < n < 10,000,000$, and $0.0001 \leq m/n \leq 100$, and wherein C is an organic ion salt represented by one of the following Chemical Formulae 2 to 5:

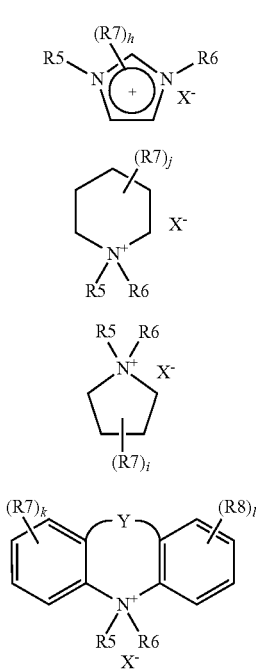

[Chemical Formula 2]

[Chemical Formula 3]

[Chemical Formula 4]

[Chemical Formula 5]

wherein, in Chemical Formulae 2 to 5, one of R5 to R8 is selected from the group of a single bond, a substituted or unsubstituted C1 to C30 alkylene group, a substituted or unsubstituted C1 to C30 heteroalkylene group, a substituted or unsubstituted C1 to C30 alkoxylene group, a substituted or unsubstituted C1 to C30 heteroalkoxylene group, a substituted or unsubstituted C6 to C30 arylene group, a substituted or unsubstituted C6 to C30 arylalkylene group, a substituted or unsubstituted C2 to C30 heteroarylene group, a substituted or unsubstituted C2 to C30 heteroarylalkylene group, a substituted or unsubstituted C5 to C20 cycloalkylene group, and a substituted or unsubstituted C2 to C30 heterocycloalkylene group, and is bound to a main chain of the polyacid copolymer, and remaining ones of R5 to R8 are each independently selected from the group of hydrogen, a substituted or unsubstituted C1 to C30 alkyl group, a substituted or unsubstituted C1 to C30 heteroalkyl group, a substituted or unsubstituted C1 to C30 alkoxy group, a substituted or unsubstituted C1 to C30 heteroalkoxy group, a substituted or unsubstituted C6 to C30 aryl group, a substituted or unsubstituted C6 to C30 arylalkyl group, a substituted or unsubstituted C6 to C30 aryloxy group, a substituted or unsubstituted C2 to C30 heteroaryl group, a substituted or unsubstituted C2 to C30 heteroarylalkyl group, a substituted or unsubstituted C2 to C30 heteroaryloxy group, a substituted or unsubstituted C5 to C20 cycloalkyl group, a substituted or unsubstituted C2 to C30 heterocycloalkyl group, a substituted or unsubstituted C1 to C30 alkylester group, a substituted or unsubstituted C1 to C30 heteroalkylester group, a substituted or unsubstituted C6 to C30 arylester group, and a substituted or unsubstituted C2 to C30 heteroarylester group, X is selected from the group of F, Cl, Br, I, $BF_4$, $PF_6$ and $(CnF_{2n+1}SO_2)_2N$, in which n is a natural number of 1 to 50, Y is selected from the group of $-CH2-$, $-CR'R''-$, $-NH-$, $-NR'-$, $-O-$, $-P-$, $-P=o-$, $-S-$, and $-SiR'R''-$, in which R' and R" are each independently selected from the group of hydrogen, a substituted or unsubstituted C1 to C10 an alkyl, a substituted or unsubstituted C6 to C20 aryl, and a substituted or unsubstituted C3 to C20 heteroaryl, h is an integer of 1 to 3, i is an integer of 1 to 8, j is an integer of 1 to 10, k is an integer of 1 to 4, and l is an integer of 1 to 4.

2. The conductive polymer as claimed in claim 1, wherein C is the organic ion salt represented by Chemical Formula 2, in which:

X is $(CF_3SO_2)_2N$,

R7 is hydrogen or a methyl group,

R6 is an ethyl group, and

R5 is one of a single bond, a methylene group, and a phenylmethylene group bound to the main chain of the polyacid copolymer.

3. The conductive polymer as claimed in claim 1, wherein the conductive polymer is a polymer which is obtained by polymerizing one selected from the group of a monomer of polyphenylene, polyphenylenevinylene, polyaniline, or a derivative thereof represented the following Chemical Formula 6; a monomer of pyrrole represented by the following Chemical Formula 7, a monomer of thiophene or a derivative thereof:

[Chemical Formula 6]

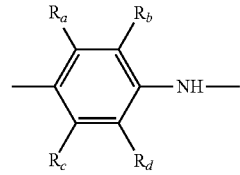

[Chemical Formula 7]

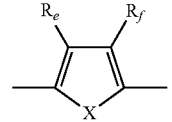

wherein, in Chemical Formulae 6 and 7,

X is NH; or a heteroatom selected from N, O, S, and P bound to a C1 to C20 alkyl group or a C6 to C20 aryl group, Ra, Rb, Rc, and Rd are each independently selected from the group of hydrogen; a C1 to C30 alkyl group; a C1 to C30 heteroalkyl group; a C1 to C30 alkoxy group; a C1 to C30 heteroalkoxy group; a C6 to C30 aryl group; a C6 to C30 arylalkyl group; a C6 to C30 aryloxy group; a C6 to C30 arylamine group; a C6 to C30 pyrrole group; a C6 to C30 thiophene group; a C2 to C30 heteroaryl group; a C2 to C30 heteroarylalkyl group; a C2 to C30 heteroaryloxy group; a C5 to C20 cycloalkyl group; a C2 to C30 heterocycloalkyl group; a C1 to C30 alkylester group; a C1 to C30 heteroalkylester group; a C6 to C30 arylester group; and a C2 to C30 heteroarylester group, and Re and Rf are each independently selected from the group of NH; or a heteroatom selected from N, O, S, and P bound to a C1 to C20 alkyl group or a C6 to C20 aryl group; a C1 to C30 alkyl group; a C6 to C30 aryl group; a C1 to C30 alkoxy group; a C1 to C30 heteroalkyl group; a C1 to C30 heteroalkoxy group; a C6 to C30 arylalkyl group; a C6 to C30 aryloxy group; a C6 to C30 arylamine group; a C6 to C30 pyrrole group; a C6 to C30 thiophene group; a C2 to C30 heteroaryl group; a C2 to C30 heteroarylalkyl group; a C2 to C30 heteroaryloxy group; a C5 to C20 cycloalkyl group; a C2 to C30 heterocycloalkyl group; a C1 to C30 alkylester group; a C1 to C30 heteroalkylester group; a C6 to C30 arylester group; and a C2 to C30 heteroarylester group.

4. The conductive polymer as claimed in claim 1, wherein the conductive polymer is a polymer obtained by polymerizing a monomer represented by the following Chemical Formula 8:

[Chemical Formula 8]

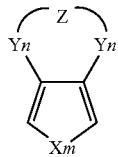

wherein, in Chemical Formula 8,

X is NH, or a heteroatom selected from N, O, S, and P bound to a C1 to C20 alkyl group or a C6 to C20 aryl group, Y is NH, or a heteroatom selected from N, O, S, and P bound to a C1 to C20 alkyl group or a C6 to C20 aryl group, m and n are each independently an integer ranging from 0 to 9, and Z is —(CH$_2$)x—CRgRh—(CH$_2$)$_y$, in which Rg and Rh are each independently selected from H, a C1 to C20 alkyl radical, a C6 to C14 aryl radical, and —CH$_2$—ORi, wherein Ri is selected from the group of H, a C1 to C6 alkyl acid a C1 to C6 alkylester, a C1 to C6 heteroalkyl acid, and a C1 to C6 alkylsulfonic acid.

5. The conductive polymer as claimed in claim 1, wherein the conductive polymer is polythiophene.

6. The conductive polymer as claimed in claim 1, wherein A is a phenylene group and B is an ionic group including a pair of a cation and an anion, the cation being H$^+$ and the anion being SO$_3^-$.

7. A conductive polymer composition for an organic photoelectric device, the conductive polymer composition comprising:
a solvent; and
the conductive polymer as claimed in claim 1.

8. The conductive polymer composition for an organic photoelectric device as claimed in claim 7, wherein the solvent is selected from the group of water, an alcohol, dimethyl formamide (DMF), dimethylsulfoxide, toluene, xylene, and chlorobenzene.

9. The conductive polymer composition for an organic photoelectric device as claimed in claim 7, further comprising a physical cross-linking agent or a chemical cross-linking agent.

10. The conductive polymer composition for an organic photoelectric device as claimed in claim 9, wherein the composition includes the physical cross-linking agent, the physical cross-linking agent being at least one selected from the group of glycerol, butanol, polyvinylalcohol, polyethyleneglycol, polyethyleneimine, and polyvinylpyrrolidone.

11. The conductive polymer composition for an organic photoelectric device as claimed in claim 9, wherein the composition includes the chemical cross-linking agent, the chemical cross-linking agent being at least one selected from the group of tetraethyloxysilane, polyaziridine, a melamine-based polymer, and an epoxy-based polymer.

12. The conductive polymer composition for an organic photoelectric device as claimed in claim 9, wherein the physical cross-linking agent is included in the composition in an amount of about 0.001 to about 5 parts by weight, based on 100 parts by weight of the conductive polymer composition.

13. The conductive polymer composition for an organic photoelectric device as claimed in claim 9, wherein the chemical cross-linking agent is included in the composition in an amount of about 0.001 to about 50 parts by weight by weight, based on 100 parts by weight of the conductive polymer composition.

14. A conductive polymer layer for an organic photoelectric device, the conductive polymer layer being formed using the conductive polymer composition as claimed in claim 7.

15. An organic photoelectric device comprising the conductive polymer layer as claimed in claim 14.

* * * * *